(12) United States Patent
Kaneyama

(10) Patent No.: US 7,459,680 B2
(45) Date of Patent: Dec. 2, 2008

(54) METHOD OF ANALYSIS USING ENERGY LOSS SPECTROMETER AND TRANSMISSION ELECTRON MICROSCOPE EQUIPPED THEREWITH

(75) Inventor: Toshikatsu Kaneyama, Tokyo (JP)

(73) Assignee: Jeol Ltd., Tokyo (JP)

( * ) Notice: Subject to any disclaimer, the term of this patent is extended or adjusted under 35 U.S.C. 154(b) by 369 days.

(21) Appl. No.: 11/393,367

(22) Filed: Mar. 30, 2006

(65) Prior Publication Data

US 2006/0255271 A1     Nov. 16, 2006

(30) Foreign Application Priority Data

Apr. 4, 2005     (JP) .............................. 2005-107494

(51) Int. Cl.
*H01J 40/00*     (2006.01)
*H01J 47/00*     (2006.01)

(52) U.S. Cl. ..................... 250/305; 250/310; 250/311; 250/397; 250/306; 250/396 ML; 250/396 R

(58) Field of Classification Search ................. 250/306, 250/305, 311, 310, 396 ML, 396 R, 397
See application file for complete search history.

(56) References Cited

U.S. PATENT DOCUMENTS 6,930,306 B2 *   8/2005   Kaji et al. ................... 250/305
7,388,198 B2 *   6/2008   Ohkura ....................... 250/305

FOREIGN PATENT DOCUMENTS

JP        2001-076664        3/2001

* cited by examiner

*Primary Examiner*—Jack I. Berman
*Assistant Examiner*—Meenakshi Sahu
(74) *Attorney, Agent, or Firm*—The Webb Law firm

(57) ABSTRACT

A method of analysis using an energy loss spectrometer and a transmission electron microscope equipped with the energy loss spectrometer. The spectrometer has a CCD camera for recording plural spectra as one photoelectric device image and a controller for batch reading in images from the camera, converting the positions of the pixels forming the images, and splitting each image into plural spectra. This permits improvement of the processing speed of the spectrometer.

10 Claims, 5 Drawing Sheets

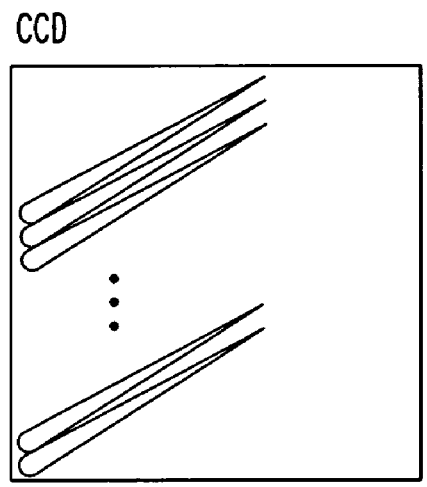
FIG.2A
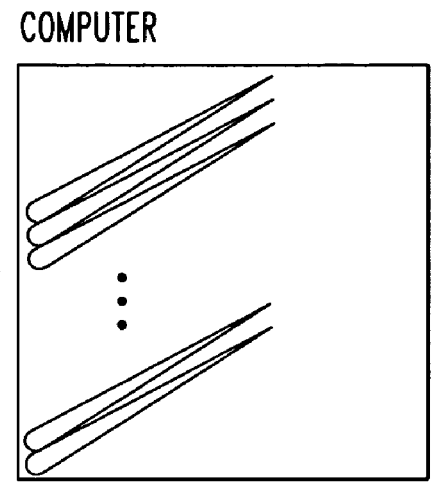
FIG.2B
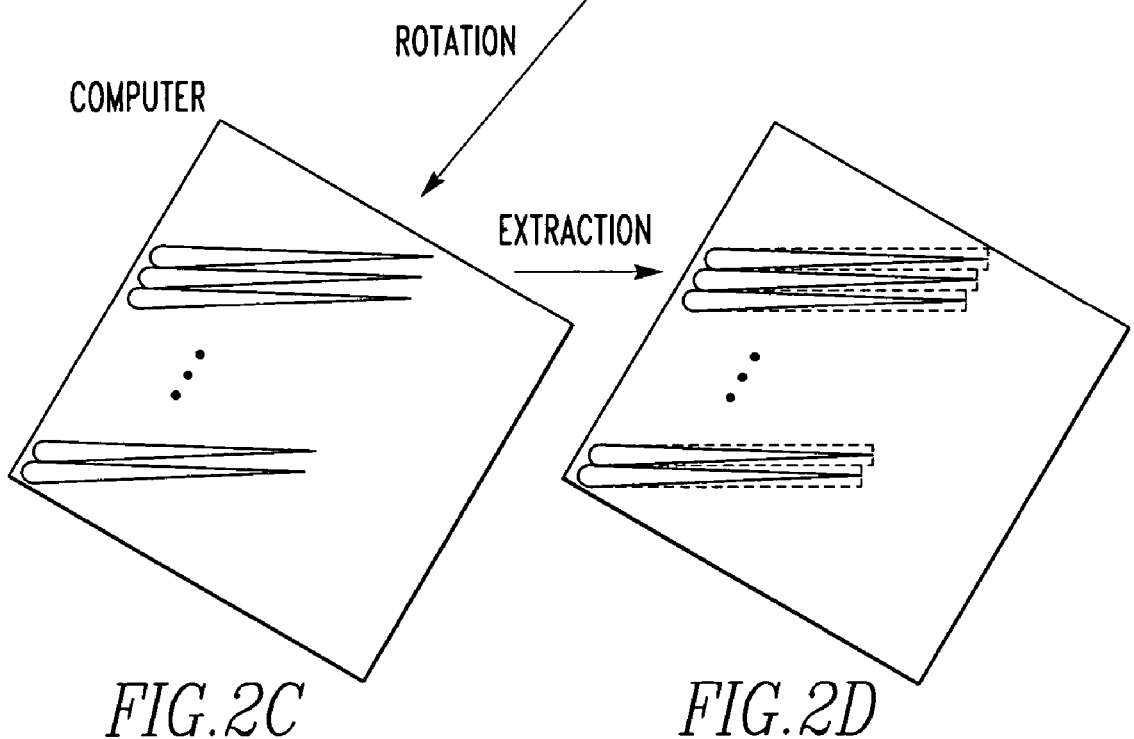
FIG.2C
FIG.2D

METHOD OF ANALYSIS USING ENERGY LOSS SPECTROMETER AND TRANSMISSION ELECTRON MICROSCOPE EQUIPPED THEREWITH

BACKGROUND OF THE INVENTION

1. Field of the Invention

The present invention relates to a method of analysis using an energy loss spectrometer and to a transmission electron microscope equipped with the energy loss spectrometer.

2. Description of Related Art

An electron energy loss spectrometer (EELS) is known as an apparatus for obtaining an energy loss spectrum of electrons transmitted through a sample by directing an electron beam at the sample. Electrons from the electron gun collide against the sample and thus suffer energy loss. Consequently, electrons with reduced energies are transmitted through the sample. The energy loss of the electrons transmitted through the sample varies depending on the species of the sample. Accordingly, the structure of the sample can be known by obtaining a spectrum of the energy loss.

In use, the EELS instrument is normally attached to a transmission electron microscope (TEM). FIG. 4 is a schematic view of the microscope. The microscope has an electron gun 1 for producing an electron beam which is focused by a condenser lens 2. A sample holder 3 is mounted behind the condenser lens 2.

An objective lens 4 focuses the electron beam transmitted through the sample placed on the sample holder 3. An intermediate lens 5 focuses the beam transmitted through the objective lens 4. A projector lens 6 magnifies the electron beam image transmitted through the intermediate lens 5. An observation chamber 7 is used to observe the electron beam image. An analyzer 8 receives the electron beam from the observation chamber 7 and obtains an energy loss spectrum. A lens system 9 focuses the beam transmitted through the analyzer 8. A detector 10 converts the electron beam image into an electrical signal. As an example, a CCD camera is used as the detector 10.

FIG. 5 is a schematic view of another transmission electron microscope. Like components are indicated by like reference numerals in both FIGS. 4 and 5. In this embodiment, the analyzer 8 is mounted between the intermediate lens 5 and the projector lens 6.

Especially, in a case where the analyzer is mounted in the imaging optical system, an operation for extracting and imaging only electrons with a certain energy can be performed, in addition to an operation for obtaining a spectrum. Therefore, there is an increasing demand for this kind of apparatus. Lenses are mounted behind the analyzer to magnify the image or spectrum.

The dispersive power of the analyzer at the energy dispersive surface is normally only several micrometers per volt. Energy dispersion referred to herein is an index indicating the distance by which electrons having energies differing by 1 volt are spaced apart. On the other hand, the resolution of the spectrum-recording medium is about 10 to 20 micrometers per pixel. The number of pixels is hundreds to thousands.

The maximum energy resolution required generally is less than about 0.5 eV. The maximum acquisition range of energies is more than hundreds of volts. To satisfy both requirements, it is necessary to highly magnify the energy loss spectrum produced at the energy dispersive surface of the analyzer or to suppress the magnification factor. That is, the magnification needs to be variable. Consequently, the lenses are disposed behind the analyzer.

The spectrum-recording medium acts also as a recording medium for electron microscope images. Generally, a two-dimensional CCD camera is used as the spectrum-recording medium. Electron energy loss spectroscopy is performed to obtain information about a sample by recording spectral images in the CCD camera 10, reading out the images, transferring them to a computer, and analyzing the distribution of the intensities of electron energies.

FIG. 6 shows the energy dispersive spectrum taken along the set direction of energy dispersion. The figure illustrates the manner in which the energy dispersive spectrum is taken along the set direction of energy dispersion. Shown in the figure are a spectral image A and an energy dispersive spectrum B. In the energy dispersive spectrum, electron energy (dE) is plotted on the horizontal axis. The distribution of the intensities of electrons having the same energy is shown in the spectrum.

A prior-art system of this kind for automatically setting the direction of energy dispersion taking account of rotation of the direction of energy dispersion according to variation of the magnification of the projector lens is known, for example, in Japanese Patent Laid-Open No. 2001-76664 (paragraphs 0008-0015 and FIG. 1)

Where a recently fabricated semiconductor device is investigated, if an elemental analysis is performed near a crystal grain boundary or electronic state of elements is investigated in relation to the dependence of the distance from the boundary, it is necessary to take a number of energy loss spectra while varying the electron beam position on the sample. The electron beam is directed at one point on the sample. The obtained spectrum is recorded in CCDs, read out, and analyzed.

At this time, it is important to minimize the spectrum acquisition time, for the following reason. If the acquisition time is prolonged, the sample will drift, the electron beam irradiation will damage the sample, or the sample will be more contaminated during this time interval. This will lead to a deterioration in the accuracy of analysis.

Even if the spectrum is stored in CCDs in a shorter time by increasing the electron density of the illuminating beam or enhancing the sensitivity of the CCD camera (e.g., in a time of $1/100$ s), the read-in time will be as long as 4 seconds provided that the number of the CCD pixels is 2,000×2,000=4,000,000 and that A/D conversion and reading into the computer are done at 100 MHz. Thus, it is obvious that the read-in time is a decisive bottleneck.

This problem can be solved by making use of the function of CCD binning. FIG. 7 illustrates the CCD binning. It is assumed that there is a CCD unit having N×N pixels as shown. The sides of the CCD sensor area are taken in the X- and Y-directions, respectively. As an example, the pixels arranged in the Y-direction are combined into one. The whole pixel arrangement is represented by one-dimensional pixel array extending in the X-direction. The number of data items is reduced. In consequence, the operating speed can be improved dramatically. In the case of the example of FIG. 7, if the pixels arrayed in the Y-direction are all combined into one, and if electric charge is accumulated in the single linear array of elements extending in the X-direction, then N×N pixels are reduced to N×1 pixels.

Incidentally, an electron lens acts to rotate the image when the lens focuses it. Rotation of the spectrum due to the electron lens located behind the analyzer presents a problem. In the diagram of FIG. 6, the direction of energy dispersion has rotated to the right downwardly. An electron lens must be mounted behind the analyzer to vary the magnification factor. At this time, if the intensity of the lens is varied, the spectrum will be rotated.

Where the intensity of the spectrum recorded in CCDs is analyzed, the intensity must be projected in a direction perpendicular to the direction of energy dispersion, and the total must be taken. Accordingly, if the direction of energy dispersion of the spectrum is not parallel to any side of the CCD sensor area, it is impossible to utilize the CCD binning when images are read from the CCDs. Rather, all the pixels must be read out always. Depending on the direction of the spectrum, it suffices to extract some pixels rather than all the pixels. Yet, the efficiency is much inferior to the case where the binning mode is utilized.

SUMMARY OF THE INVENTION

It is an object of the present invention to provide a method of analysis using an energy loss spectrometer (i.e., a method of energy loss spectroscopy analysis) capable of providing improved processing speed. It is another object of the present invention to provide a transmission electron microscope equipped with this energy loss spectrometer.

In a method of energy loss spectroscopy analysis according to an embodiment of the present invention, an electron beam is directed at a sample, and spectra are obtained by causing the electron beam transmitted through the sample to pass through an analyzer. This method of analysis is characterized in that plural spectra are batch recorded in a photoelectric device.

Other objects and features of the invention will appear in the course of the description thereof, which follows.

BRIEF DESCRIPTION OF THE DRAWINGS

FIGS. 2A-2D illustrate the principle of operation of the present invention;

DESCRIPTION OF THE PREFERRED EMBODIMENTS

Embodiments of the present invention are hereinafter described in detail with reference to the accompanying drawings.

Figure 1:
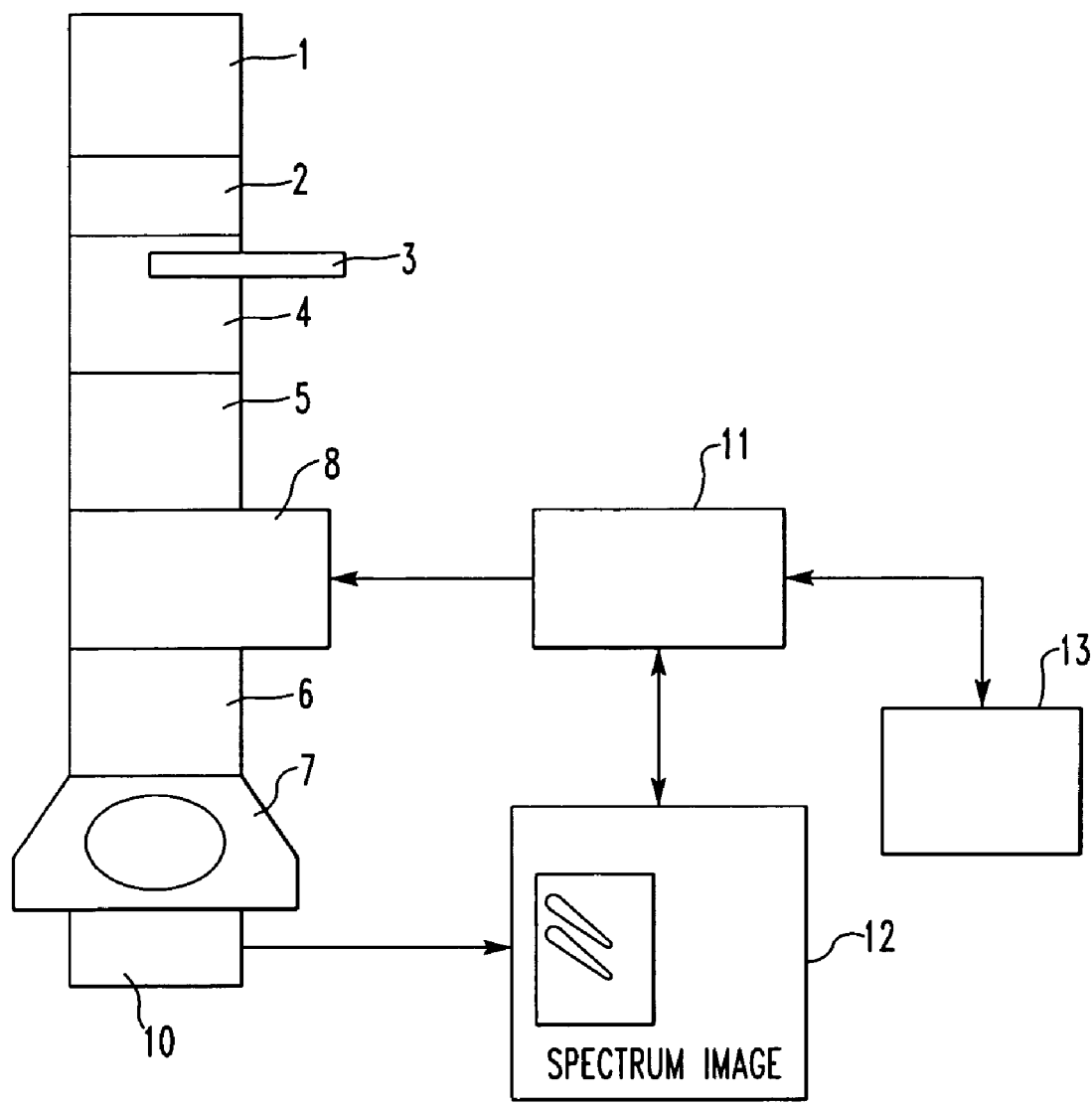
FIG. 1 is a block diagram of an apparatus according to one embodiment of the present invention.
Figure 5:
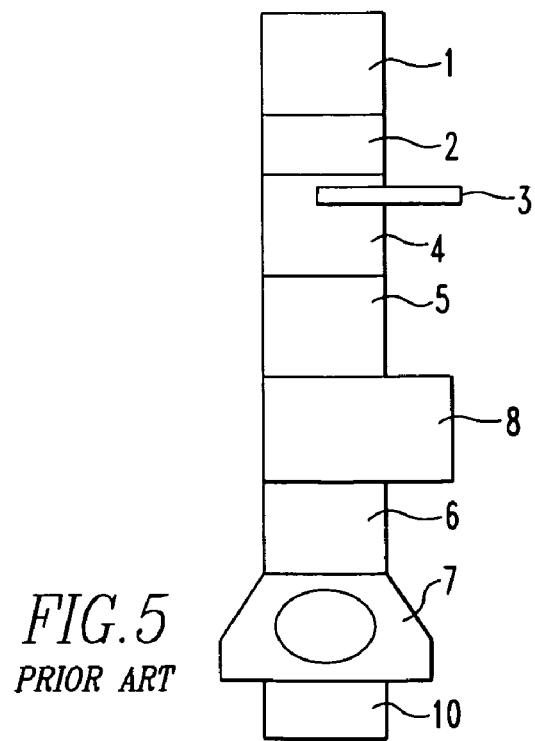
FIG. 5 is a schematic view of another known transmission electron microscope.
Figure 6:
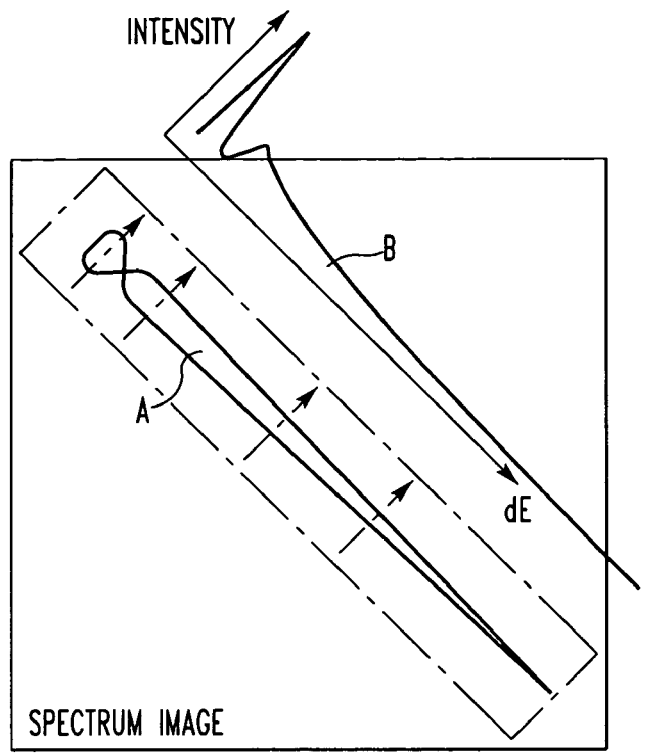
FIG. 6 is a diagram of an energy dispersive spectrum taken along a set direction of energy dispersion.
Figure 7:
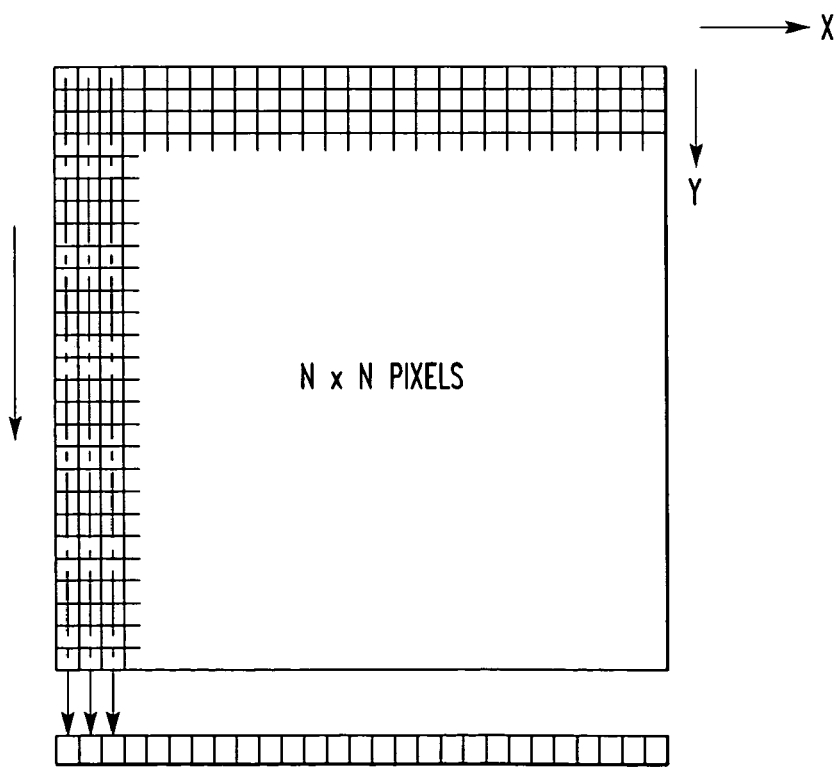
FIG. 7 is a diagram illustrating CCD binning.

FIG. 1 shows the configuration of an apparatus according to one embodiment of the present invention. Note that like components are indicated by like reference numerals in both FIGS. 1 and 5. The apparatus has an electron gun 1 producing an electron beam that is focused by a condenser lens 2. A sample holder 3 is mounted behind the condenser lens 2.

An objective lens 4 focuses the electron beam transmitted through the sample placed on the sample holder 3. An intermediate lens 5 focuses the beam transmitted through the objective lens 4. An analyzer 8 is disposed behind the intermediate lens 5. A projector lens 6 magnifies the electron beam image transmitted through the analyzer 8. An observation chamber 7 is used to observe the electron beam image. A CCD camera 10 consisting of arrays of photoelectric elements converts the electron beam image into an electrical signal.

An image processor 12 acting as an image-processing means receives the output from the CCD camera 10 and produces a spectral image and an energy dispersive spectrum. A controller 11 is connected with the image processor 12 and with the analyzer 8 and controls the analyzer 8 and image processor 12. The controller 11 acts also as an image-processing means. For example, a microcomputer is used as the controller 11. A memory 13 is connected with the controller 11. Plural spectra are recorded as one CCD image in the memory 13 and then images, which have been batch read into it, are stored. The operation of the apparatus constructed as described so far is described as follows.

In the present invention, plural spectra are recorded as one CCD image in the CCD camera 10 forming a spectrum-recording medium and then data about spectral images are batch read in from the CCD camera 10. Subsequently, calculations are performed for a rotation to split the single CCD image into plural spectral images. By adopting this technique, the read-in time can be shortened effectively when a multiplicity of spectra are gained.

Electrons emitted from the electron gun 1 and accelerated to a desired energy are focused by the condenser lens 2 and directed at a sample (not shown) placed on the sample holder 3. The electrons hitting the sample pass through it intact. The electrons going out of the sample are classified into two types of electrons. The energies of electrons of the first type remain unchanged. Electrons of the second type are deprived of energy by atoms constituting the sample and lose their own energy.

The transmitted electrons are adjusted to prescribed optical conditions by the objective lens 4 and intermediate lens 5 and are guided to the analyzer 8. The electrons emerging from the analyzer 8 have exit angles different among different energies and thus form a spectrum. The spectrum is magnified by the projector lens 6 and focused onto the CCD camera 10. Where an energy loss spectrum is derived from the vicinities of a grain boundary within the sample, an electron beam is directed at the sample. The obtained spectrum is recorded in the CCD camera 10 while varying the beam position on the sample.

The beam alignment coil A of the irradiation lens system of the microscope is used to vary the beam position on the sample. To determine the position on the CCD camera 10 onto which the spectrum is projected, the beam alignment coil B of the imaging lens system is used. If the beam position is varied by changing the operating conditions of the coil A forming a first deflection means, the position on the CCD camera onto which the spectrum is projected is varied by changing the operating conditions of the coil B forming a second deflection means. The electrical currents supplied to the coils A and B are controlled by the controller 11.

A series of spectra depending on the beam position on the sample is recorded in the CCD camera 10 in this way. Then, the CCD image intensity is read in. The image data in the CCD camera 10 is entered into the image processor 12 and converted into digital data. The data is then stored in the memory 13 via the controller 11. The method of the present invention permits faster processing than the method in which each individual spectral image is read from the CCD camera 10 in turn. For example, if 100 spectra are recorded as one CCD image and read out in a batch, the read-out time can be shortened by a factor of 100.

The controller 11 performs processing necessary to rotate the image data stored in the memory 13 to return each image rotated due to use of electron lenses to the original state as described in further detail later. Furthermore, the controller 11 extracts individual spectral images from the rotated spectral image to form a series of spectra of vicinities of a grain boundary in the sample.

FIGS. 2A-2D illustrate the operation of the present invention. Shown in FIG. 2A are plural spectral images recorded by the CCD camera 10. Shown in FIG. 2B are images recorded in the memory 13 via the controller 11. Shown in FIG. 2C are images obtained by making rotation corrections to the images recorded in the memory 13. Shown in FIG. 2D is a diagram illustrating processing for extracting each spectral image subjected to a rotation correction.

Figures 3A, 3B:
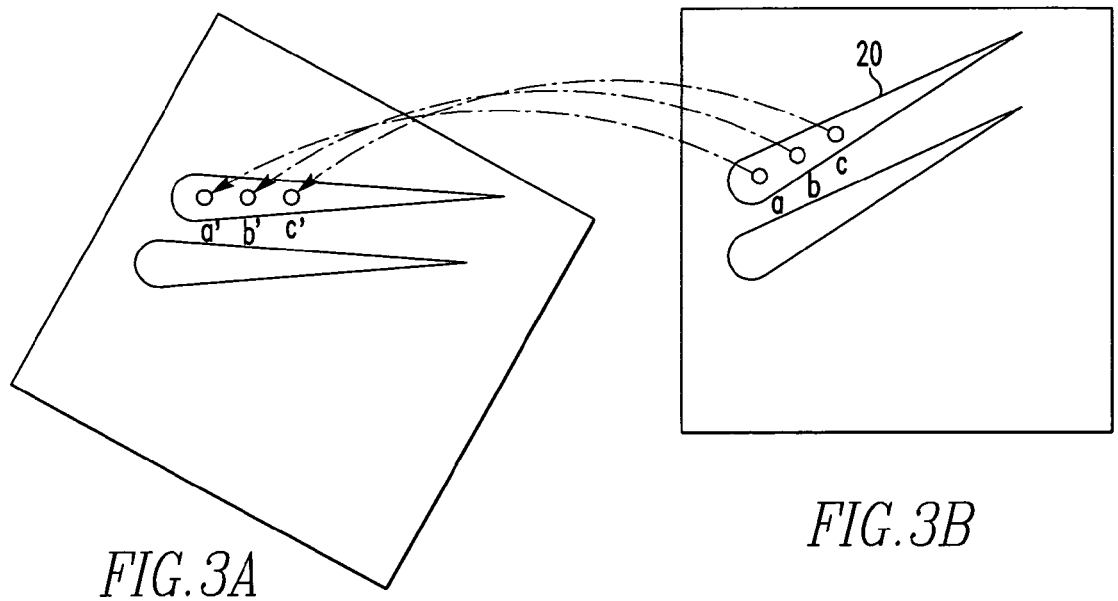
FIGS. 3A and 3B illustrate conversion of pixel positions.
Figure 4:
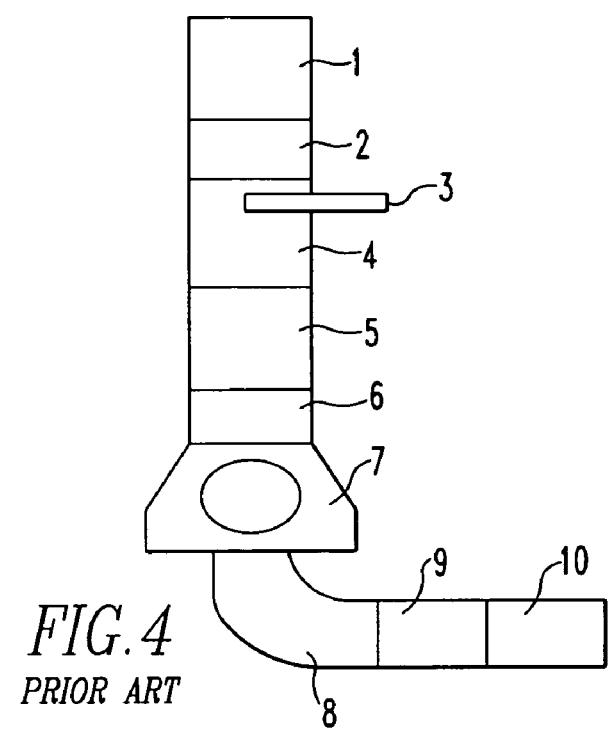
FIG. 4 is a schematic view of a known transmission electron microscope.

The rotation correcting processing of FIG. 2C can be performed using a well-known image processing technique. FIGS. 3A and 3B illustrate conversion of pixel positions, the conversion being one of rotation correcting processing operations. Shown in FIG. 3A are images stored in the memory 13. Shown in FIG. 3B are images obtained by making rotation corrections. It is assumed that there are pixels a, b, and c on an image 20. The addresses of the pixels a, b, and c are previously known. Processing for converting the pixel positions is performed based on information about image rotation to restore the rotated image to the original state, the information being dependent on variation of the magnification factor of the projector lens.

As shown in FIG. 3B, in a case where each image is converted into a horizontally facing image, the pixel image at a is assigned to position a'. The pixel image at b is assigned to position b'. The pixel image at c is assigned to position c'. Rotation corrections can be made to the images by performing such processing for position conversions. A spectral image can be converted into a horizontally facing image by such a rotation correction to the image. The direction of energy dispersion of a spectrum can be brought into coincidence with the horizontal direction (X-direction). Therefore, the controller 11 can obtain an energy dispersive spectrum by extracting each individual spectral image as shown in FIG. 2D, accumulating the intensities of the spectral images (digital images) in the Y-direction perpendicular to the direction of energy dispersion, and graphing the accumulated intensities.

The processing for converting pixel positions may be performed by the controller 11 as described previously or by the image processor 12. In addition, the aforementioned extraction (splitting) of the spectral images and processing for obtaining an energy dispersive spectrum may be performed by the image processor 12 instead of the controller 11.

In the above embodiment, CCDs are taken as an example of photoelectric device. The present invention is not limited to this. Other photoelectric devices, such as CMOS, can also be used.

As described in detail so far, according to the present invention, plural spectra are recorded as one CCD image. Then, such images are batch read in. Then, with respect to the images batch read in, the positions of the pixels are converted. Consequently, the processing speed can be improved.

Having thus described my invention with the detail and particularity required by the Patent Laws, what is desired protected by Letters Patent is set forth in the following claims.

The invention claimed is:

1. A method of analysis using an energy loss spectrometer adapted to obtain a spectrum by directing an electron beam at a sample such that the beam is transmitted through the sample and by passing the beam through an analyzer, said method of analysis comprising the step of:
   batch recording plural spectra in a single photoelectric device.

2. A method of analysis using an energy loss spectrometer as set forth in claim 1, comprising the steps of:
   batch reading in plural spectral images recorded in said photoelectric device;
   extracting each individual spectral image from the spectral images which have been batch read in; and
   accumulating intensities of the individual spectral images in a direction perpendicular to the direction of energy dispersion of each spectrum and graphing the accumulated intensities, thus obtaining an energy dispersive spectrum.

3. A method of analysis using an energy loss spectrometer as set forth in claim 2, wherein positions of pixels forming the images which have been batch read in are converted and each individual spectral image is extracted from the spectral images whose pixel positions have been converted.

4. A method of analysis using an energy loss spectrometer as set forth in claim 1 or 2, wherein a spectrum obtained at each beam position on the sample is recorded at a different position in the photoelectric device by varying the beam position on the sample.

5. A method of analysis using an energy loss spectrometer adapted to obtain a spectrum by directing an electron beam at a sample such that the beam is transmitted through the sample and by passing the beam through an analyzer, said method of analysis comprising the steps of:
   obtaining an image of said spectrum;
   converting positions of pixels forming the image of the spectrum; and
   accumulating intensities of the image of the spectrum, which has been subjected to the conversion of the pixel positions, in a direction perpendicular to the direction of energy dispersion of the spectrum and graphing the accumulated intensities, thus obtaining an energy dispersive spectrum.

6. A transmission electron microscope equipped with an energy loss spectrometer adapted to obtain a spectrum by directing an electron beam at a sample such that the beam is transmitted through the sample and by passing the beam through an analyzer, said transmission electron microscope comprising:
   means for batch recording plural spectra in one photoelectric device.

7. A transmission electron microscope equipped with an energy loss spectrometer as set forth in claim 6, said transmission electron microscope comprising:
   image-processing means for (a) batch reading in plural spectral images recorded in said photoelectric device, (b) extracting each individual spectral image from the spectral images batch read in, (c) accumulating intensities of the individual spectral images in a direction perpendicular to the direction of energy dispersion of each spectrum, and (d) graphing the accumulated intensities, thus obtaining an energy dispersive spectrum.

8. A transmission electron microscope equipped with an energy loss spectrometer as set forth in claim 7, wherein said image-processing means converts positions of pixels forming the images which have been batch read in and extracts each individual image of the spectrum from the images of the spectrum whose pixel positions have been converted.

9. A transmission electron microscope equipped with an energy loss spectrometer adapted to obtain a spectrum by directing an electron beam at a sample such that the beam is transmitted through the sample and by passing the beam through an analyzer, said transmission electron microscope comprising:

means for obtaining an image of said spectrum; and image-processing means for (a) converting positions of pixels forming said obtained image of the spectrum, (b) accumulating intensities of the image of the spectrum, whose pixel positions have been converted, in a direction perpendicular to the direction of energy dispersion of the spectrum, and (c) graphing the accumulated intensities, thus obtaining an energy dispersive spectrum.

10. A transmission electron microscope equipped with an energy loss spectrometer, said transmission electron microscope comprising:

an electron gun for emitting an electron beam;

a condenser lens for focusing the beam from the gun onto a sample;

first deflection means for deflecting the beam directed at the sample to vary the position of the beam on the sample;

an analyzer for energy-dispersing the electron beam, which has been released from the sample, in a given direction to form a spectrum;

photoelectric means for recording the spectrum formed by the analyzer; and second deflection means for deflecting the spectrum formed by the analyzer to record each spectrum, which is obtained at each different beam position on the sample, at a different position in the photoelectric means.

* * * * *